(12) United States Patent
Lentine et al.

(10) Patent No.: US 6,271,777 B1
(45) Date of Patent: Aug. 7, 2001

(54) DATA TRANSMISSION SYSTEM EMPLOYING CLOCK-ENRICHED DATA CODING AND SUB-HARMONIC DE-MULTIPLEXING

(75) Inventors: Anthony Lodovico Lentine, St. Charles, IL (US); Nina L. Taranenko, Holmel; Ted Kirk Woodward, Holmdel, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/438,794

(22) Filed: Nov. 12, 1999

(51) Int. Cl.$^7$ .................................................. H03M 9/00

(52) U.S. Cl. ............................................................ 341/100

(58) Field of Search ................................... 341/100, 101, 341/143

(56) References Cited

U.S. PATENT DOCUMENTS

| | | |
|---|---|---|
| 5,644,418 | 7/1997 | Woodward . |
| 6,097,323 * | 8/2000 | Koga ..................................... 341/100 |
| 6,121,906 * | 9/2000 | Kim ..................................... 341/100 |

OTHER PUBLICATIONS

C–K Yang et al., "A 0.8–μm CMOS 2.5 Gb/s Oversampling Receiver and Transmitter for Serial Links," IEEE Journal of Solid–State Circuits, vol. 31, No. 12, pp. 2015–2023, Dec. 1996.

* cited by examiner

Primary Examiner—Brian Young
(74) Attorney, Agent, or Firm—Ryan, Mason & Lewis, LLP

(57) ABSTRACT

A method for use in a data transmission system comprises the steps of: (i) adding timing information to a serial data stream; (ii) recovering the timing information from the serial data stream to generate a plurality of clock signals associated with the timing information, each clock signal having a common frequency and a different phase associated therewith, the common frequency being less than a frequency associated with the serial data stream; and (iii) converting the serial data stream to a plurality of parallel data streams respectively using the plurality of clock signals. The timing information may be added to the serial data stream at a data transmitter portion of the system. The invention provides for various ways to add the timing information to the serial data stream, i.e., enrich the serial data stream with the timing information. This timing information is preferably phase locked to the data and has a frequency less than the serial data transmission rate. Recovery of this lower speed timing information, e.g., clock tones, may be performed via filtering and phase aligning the timing information to generate the plurality of clock signals. Conversion of the serial data stream to the plurality of parallel data streams may then include using the clock signals to respectively sample or de-multiplex the serial data stream to yield the plurality of parallel data streams. The parallel data streams have a clock rate lower than that associated with the received serial data stream.

24 Claims, 7 Drawing Sheets

— SERIES 1

DATA TRANSMISSION SYSTEM EMPLOYING CLOCK-ENRICHED DATA CODING AND SUB-HARMONIC DE-MULTIPLEXING

FIELD OF THE INVENTION

The invention relates generally to data transmission systems and, more particularly, to such systems employing clock-enriched data coding on a transmission side and sub-harmonic de-multiplexing on a receiver side.

BACKGROUND OF THE INVENTION

It is common for serial data links to be constructed from subsidiary data streams at a lower rate. This so-called time division multiplexing requires a method for de-multiplexing data at the receiver which in turn requires timing information. For binary data transmission, this clock recovery operation is commonly done at the serial data frequency of the transmission system, e.g., the recovered clock frequency matches the serial transmission rate. These operations are currently done using nonlinear circuit elements and phase-locked-loop (PLL) techniques, or high-Q filters, as described in A. Buchwald, K. Martin, "Integrated Fiber-Optic Receivers," Kluwer, 1995, ISBN0-7923-9549-2 and "Monolithic phase locked loops and clock recovery circuits," Behzad Razavi (ed.) IEEE press, 1996, the disclosures of which are incorporated herein by reference. Such methods are complex and require high speed circuitry.

Therefore, it would be highly desirable to provide methods and apparatus for providing clock-enriched data coding at a transmitter end of a data transmission system and sub-harmonic de-multiplexing at a receiver end of the system in order to overcome the shortcomings of the prior art, as mentioned above and which otherwise exist in the art.

SUMMARY OF THE INVENTION

In the present invention, we provide for the addition of timing information to the transmitted data stream such that the use of high speed PLLs and high Q filters, as well as nonlinear circuit elements preceding them, can be avoided. Furthermore, by extracting timing information at a frequency less than that of the serial data transmission frequency in accordance with the invention, the circuit elements that are employed need not operate at this high frequency, but at the lower rate of the subsidiary data streams, thereby yielding further simplification. Simplification of the receiver typically yields manufacturing and operational cost savings. Thus, as will be explained, the present invention provides methods and apparatus for clock-enriched data coding at a transmitter end of a data transmission system and sub-harmonic de-multiplexing at a receiver end of the data transmission system.

In one aspect of the invention, a method for use in a data transmission system comprises the steps of: (i) adding timing information to a serial data stream; (ii) recovering the timing information from the serial data stream to generate a plurality of clock signals associated with the timing information, each clock signal having a common frequency and a different phase associated therewith, the common frequency being less than a frequency associated with the serial data stream; and (iii) converting the serial data stream to a plurality of parallel data streams respectively using the plurality of clock signals.

The timing information may be added to the serial data stream at a data transmitter portion of the system. The invention provides for various ways to add the timing information to the serial data stream, i.e., enrich the serial data stream with the timing information. In one embodiment, a transmission code used to encode the data stream may be modified to insert a transition bit pattern in a given code sequence, wherein the transition bit pattern corresponds to the timing information. In another embodiment, a code character may be inserted between code sequences, wherein the code character corresponds to the timing information. In the two embodiments above, the transition bit patterns and code characters preferably give rise to one or more sub-harmonic clock tones in the serial data stream. In yet another embodiment, the timing information may be inserted directly into the serial data stream, as a discrete clock tone. It is appreciated that in a preferred embodiment the timing information added in the form a clock signal has a well-defined (e.g., phase-locked) relationship to the transmitted data. This is because a preferred method for inserting the timing information utilizes the same clock frequency used to generate the multiplexed data stream, and thereby is necessarily phase-locked to the transmitted data. Once recovered, then, the receiver need only perform a phase alignment operation on the received clock signal.

Recovery of the timing information, e.g., clock tones, may be performed via filtering and phase aligning the timing information to generate the plurality of clock signals. Conversion of the serial data stream to the plurality of parallel data streams may then include using the clock signals to respectively sample or de-multiplex the serial data stream to yield the plurality of parallel data streams. It is to be appreciated that the plurality of parallel data streams may also have a frequency that is less than the frequency associated with the serial data stream.

Advantageously, the inventive techniques described herein allow a receiver circuit to use lower speed components, or at least fewer high speed components, thereby significantly reducing design parameters such as, for example, power, size, and cost. Similarly, in an integrated circuit embodiment, the invention also provides significant reduction in, for example, power, size and cost requirements. In one embodiment, the invention may be implemented in accordance with a fiber optic data transmission system.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The following description will illustrate the invention using an exemplary optical 8b/10b code-based communication system. It should be understood, however, that the invention is not limited to use with any particular type of system configuration. The invention is instead more generally applicable to any data transmission system in which it is desirable to enrich a serial data stream, to be transmitted, with timing information which may then be used to de-multiplex the received serial data stream into multiple parallel data streams at a rate that is below the rate of the received data stream.

In accordance with the present invention, various illustrative techniques for enriching a serial data stream with timing information at a data transmitter portion of a data transmission system will be discussed below. It is to be understood, however, that other clock-enriched data coding techniques and variations may be employed to yield one or more of the advantages associated with the present invention. The term "enrich" may have a different meaning depending on the technique applied. That is, enriching the data stream may include encoding timing information into the stream, directly inserting timing information into the stream, etc.

Figure 1:
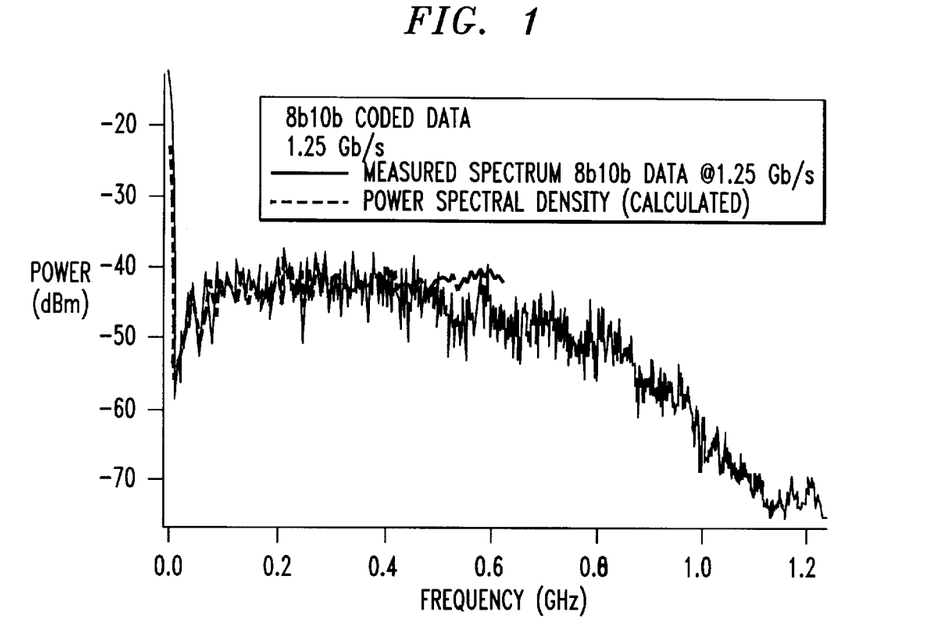
FIG. 1 is a graphical representation of spectral content of an 8b/10b coded pseudo-random sequence.
Figure 2:
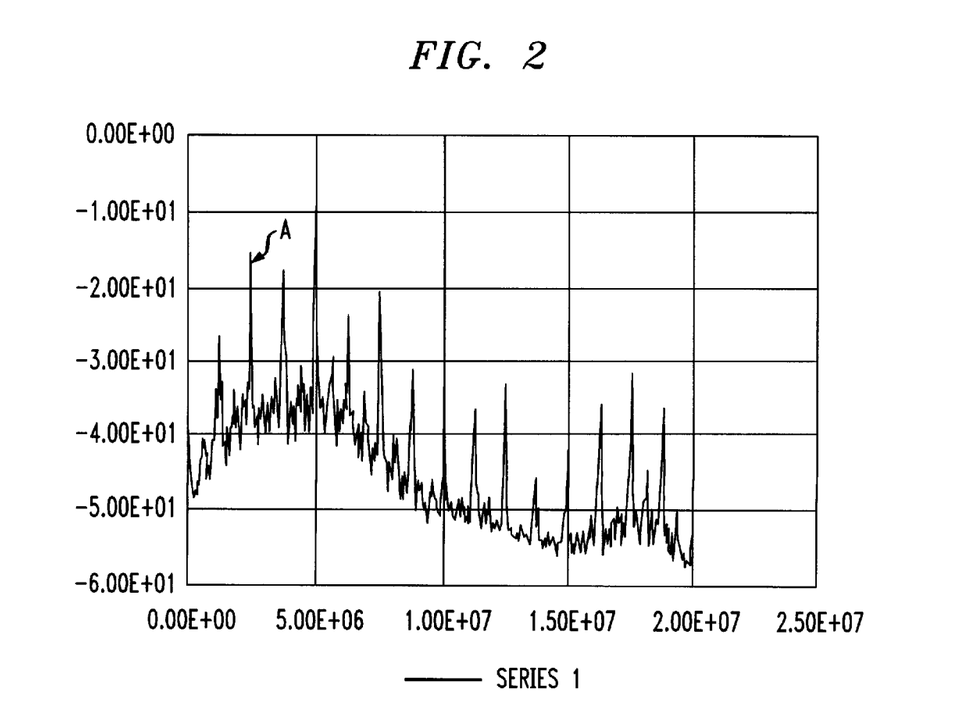
FIG. 2 is a graphical representation of an radio frequency spectrum of an 8b/10b coded packet data transmission signal illustrating a clock-enriched data stream according to the invention.

Referring to FIG. 1, a graphical representation of spectral content of an 8b/10b coded pseudo-random sequence is shown. The solid line represents the measured spectrum associated with the 8b/10b data at 1.25 Gb/sec (gigabits per second), while the dashed line represents the calculated power spectral density. FIG. 2 illustrates a radio frequency (RF) spectrum of an 8b/10b coded packet data transmission signal having a 1.0 Gb/sec data rate and a 1.25 G (giga) baud symbol rate which is exemplary of a data stream that is clock-enriched according to the invention. It is to be understood that each "spike" in the RF spectrum, for example, one of which is illustratively denoted by the letter A, represents the added timing information or clock tone in the data stream. Several illustrative approaches for generating the clock tones A will be described below. Such spectra can be expected to scale with the data rate, e.g., 12.5 Gb/sec 8b/10b coded data will have alternating current (ac) coupling to approximately 1.25 GHz.

Figure 3:
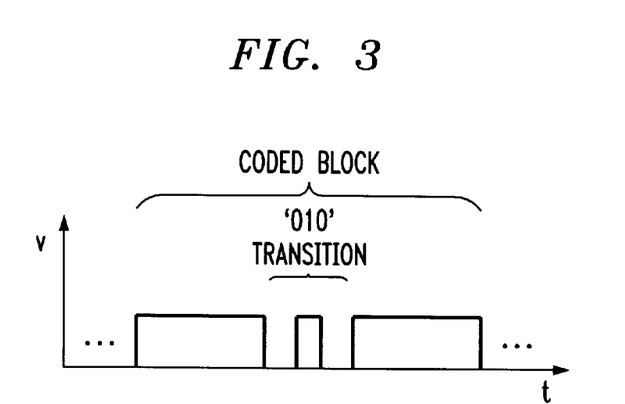
FIG. 3 is a graphical representation of a method of generating a clock-enriched data stream according to a first illustrative embodiment of the invention.

In a first embodiment, a clock-enriched data coding method includes modifying the 8b/10b coding sequence to guarantee a transition at a particular point in each encoded block, e.g., between the third and fourth bits of an 8b/10b sequence. Thus, the construction of actual code words used to encode a data stream is modified to include a transition bit pattern within a code block or sequence. This is illustrated in FIG. 3. As shown, a transition bit pattern of '010' is present in a coded block. The transition is thus repeated at regular intervals in the coded data stream which gives rise to respective clock tones A (sub-harmonic tones of the signal shown in FIG. 2) in the RF spectrum. It is to be understood that, preferably, no additional physical components are necessarily required to implement the transition bit pattern since it is built into the 8b/10b code (or whichever code is being employed). It is to be understood that the term "sub-harmonic" refers to the fact that the clock tones are preferably at a lower frequency than the serial data rate.

Figure 4:
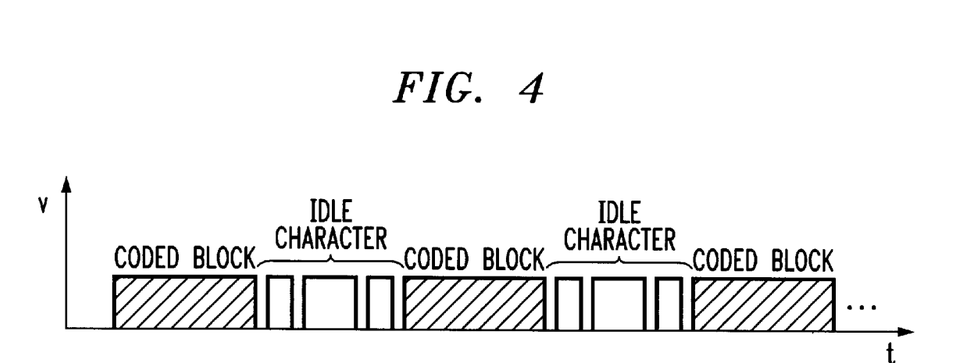
FIG. 4 is a graphical representation of a method of generating a clock-enriched data stream according to a second illustrative embodiment of the invention.

In a second embodiment, special characters may be included in the transmission of the data whose repeated presence gives rise to a desired clock tone. This is illustrated in FIG. 4. As shown, an "idle" character is repeated between each coded packet. The repeated idle character has a predetermined bit pattern which gives rise to respective clock tones A (sub-harmonic tones of the signal shown in FIG. 2) in the RF spectrum. Again, no additional physical components are necessarily required to implement the idle character since it is built into the transmission code being employed.

In a third embodiment, a clock tone can be multiplexed directly into the data stream at a frequency at which the information content of the signal spectrum is sufficiently low. For example, in an 8b/10b coded data stream with a line rate of 1.25 Gb/sec, there is ac coupling to approximately 125 MHZ (megahertz), as seen in FIG. 1. That is, the power content is greatly reduced at lower frequencies and, thus, a clock tone can be directly inserted into the coded data at such lower frequencies.

Figure 5A:
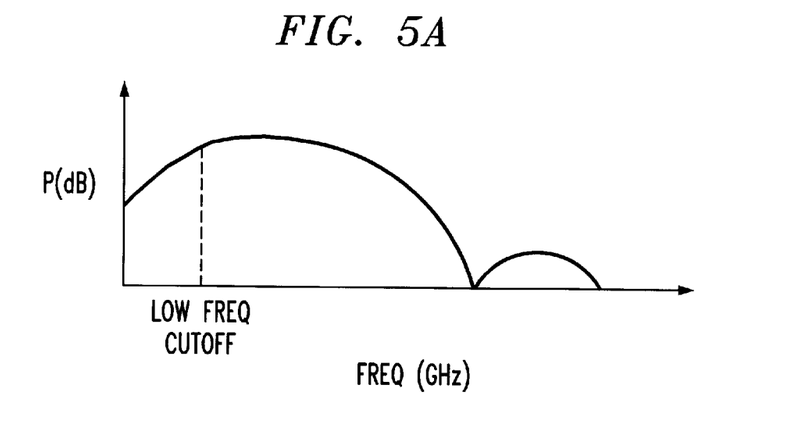
FIGS. 5A through 5C illustrate a schematic diagram, and related graphical representations, for implementing a method of generating a clock-enriched data stream according to a third illustrative embodiment of the invention.
Figure 5B:
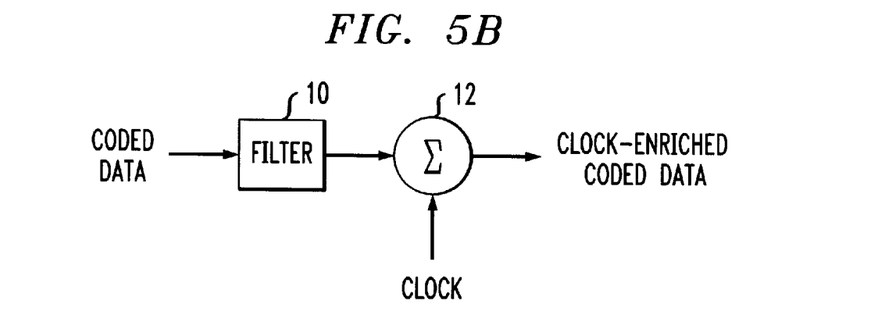
Figure 5C:
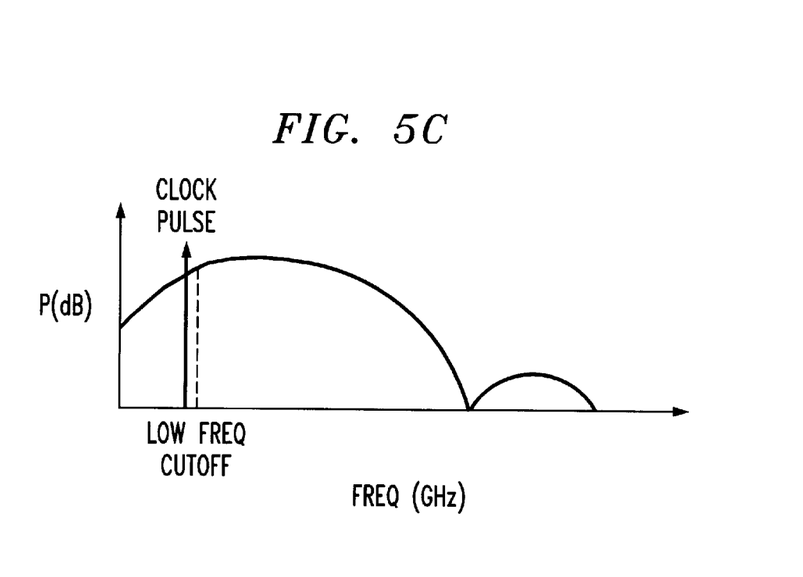

This third approach is illustrated in FIGS. 5A through 5C. It is known that the 8b/10b coding scheme will not transmit more than four zero or one bits in a row in a given 10 bit data word. Further, such data will not have an excess, or running disparity, of greater than plus or minus one, zero or one bit across 10 bit data words. Such a well-balanced transmission leads to a low frequency cutoff of about 125 MHZ. The low frequency cutoff is shown in the illustrative 8b/10b spectrum in FIG. 5A. For example, this may be 3 dB below the peak level of the signal, however, other values may be more suitable in a particular application. Thus, there is sufficient lower frequency space, e.g., at or below 125 MHZ, to directly insert a clock tone in the data stream. FIG. 5B illustrates an exemplary circuit for accomplishing this procedure. As shown, the coded data signal is filtered in a filter 10. Depending on the type of coding scheme, the filter 10 may not be necessary. In any case, a conventional coding scheme-dependent filter may be employed. Then, the filtered data is provided to one input of a power combiner 12. The clock signal to be inserted into the data stream is provided to a second input of the power combiner. The power combiner serves to multiplex the clock signal with the serial data stream. Thus, the output of the power combiner is the clock-enriched coded data stream, which may then be transmitted. FIG. 5C illustrates a spectral diagram of the clock-enriched coded data stream having a 125 MHZ clock signal inserted below the low frequency cutoff point. It is to be understood that the discrete tone could preferably be inserted at a low frequency cutoff point of approximately one-tenth the serial data stream rate, however, the invention is not so limited.

In addition to providing techniques for enriching the transmitted serial data stream with clock tones, the invention provides techniques for extracting this timing information from the serial data stream at a data receiver portion of the data transmission system. The extracted timing information may then be used for a variety of applications. For example, the timing information may be used to convert the received serial data stream into multiple parallel data streams which have a lower signal rate than that of the serial data stream.

Figure 6:
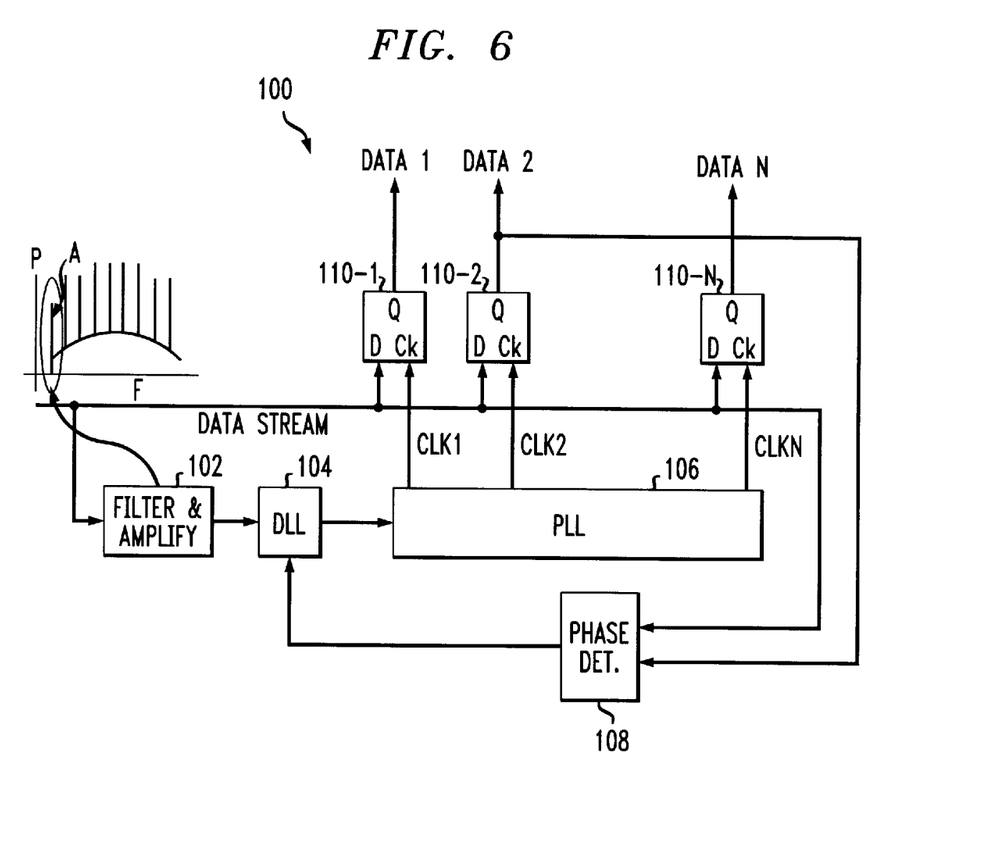
FIG. 6 is a schematic diagram of a sub-harmonic clock recovery and de-multiplexing circuit according to a first illustrative embodiment of the invention.

Referring now to FIG. 6, a schematic diagram of a sub-harmonic clock recovery and de-multiplexing circuit according to a first illustrative embodiment of the invention is shown. The circuit 100 includes a filtering and amplification circuit 102, a delay locked loop (DLL) circuit 104, a phase locked loop (PLL) circuit 106, a phase detector 108, and a plurality of de-multiplexers 110-1 through 110-N. As shown in FIG. 6, the input data stream is received by the circuit 100 wherein the filtering and amplifier circuit 102 filters the clock tones A from the serial data stream and then amplifies them to generate a timing signal. Conventional filtering and amplifying techniques may be employed to recover the timing signal from the serial data stream.

The timing signal recovered from the data stream is used to provide a reference signal with proper phase and frequency to the PLL circuit 106. The PLL circuit 106 generates multiple phases of a synchronous clock signal which are respectively used to de-multiplex the serial data stream at each of the de-multiplexers 110. That is, each clock signal output by the PLL circuit to the clock input (Ck) of a de-multiplexer 100 is at a different phase. Advantageously, however, the frequency of the synchronous clock is lower than the rate of the serial data stream.

The various phases of the clock signals that are provided by the PLL circuit to the de-multiplexers preferably should be properly phase aligned with the data in the serial data stream in order to accurately produce de-multiplexed parallel data streams. In other word, it is preferred that the PLL clock phases have an optimal relationship to the input data at the sampling gates (D) of the de-multiplexers 110. Proper phase alignment is provided by the DLL circuit 104 and the phase detector 108. The function of the DLL and the phase detector is that of an automatically adjustable delay line to provide proper timing of the reference clock to the PLL.

The phase detector 108 compares the input serial data stream to one of the parallel de-multiplexed output data streams from a de-multiplexer 110 and detects any phase difference between the streams. The phase difference is provided to the DLL circuit 104 which uniformly shifts the phase of the multiple clock signals output from the PLL circuit to the de-multiplexers 110 by applying a phase shift to the timing signal received from the filter and amplifier circuit 102. The phase shift is a fiction of the detected phase difference. While the clock signals output by the PLL circuit are the same frequency, as previously stated, they differ in phase. Thus, the group of multiple phase output clock signals of a PLL circuit are typically referred to as a "comb." The DLL circuit shifts the comb based on a phase difference signal provided thereto by the phase detector 108. The phase alignment operation is repeated until the edges of the synchronous clock signals provided to the de-multiplexers by the PLL circuit are aligned with the input data streams (input D).

Once the clock signals are phase aligned, the de-multiplexers (D-latches) are able to generate respective de-multiplexed data streams. Advantageously, since the frequency of the clock tones extracted from the input serial data stream is lower than the frequency of the input serial data stream, and since the synchronous clock output by the PLL is derived from this extracted timing information, the parallel data streams output by the de-multiplexers are also at a lower frequency than the serial input data stream.

It is to be appreciated that since the phase detector 108 is using the serial input data stream directly in its phase detection operation, the phase detector circuit in FIG. 6 is operating at the serial input data rate.

The phase detector 108 may be implemented in a variety of conventional ways, for example, using digital and analog circuits as described in A. Buchwald, K. Martin, "Integrated Fiber-Optic Receivers," Kluwer, 1995, ISBN0-7923-9549-2, and "Monolithic phase locked loops and clock recovery circuits," Behzad Razavi (ed.) IEEE press, 1996. As an example, consider an analog multiplier supplied with two sine waves, each having the same frequency, but with different phases. When multiplied, basic trigonometry shows that the product term contains a constant that is proportional to the phase difference between the two signals. When low-pass filtered, then, this dc value (proportional to the phase offset) can be used as a control signal in a feedback loop. Thus, such a signal may be provided by the phase detector 108 to the DLL circuit 104. It is to be appreciated that the DLL and PLL circuits may also be implemented in a variety of conventional ways, for example, also using circuits described in the A. Buchwald et al. and Razavi references mentioned above.

Figure 7:
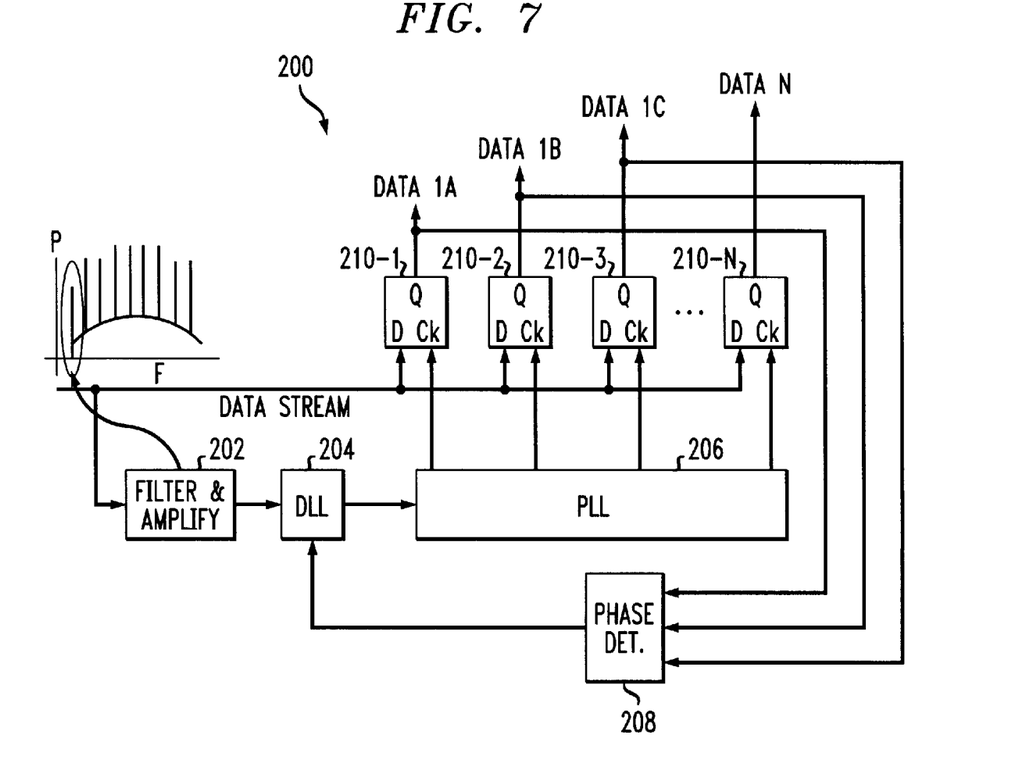
FIG. 7 is a schematic diagram of a sub-harmonic clock recovery and de-multiplexing circuit according to a second illustrative embodiment of the invention.

Referring now to FIG. 7, a schematic diagram of a sub-harmonic clock recovery and de-multiplexing circuit according to a second illustrative embodiment of the invention is shown. It is to be appreciated that the circuit 200 and it associated components in FIG. 7 is similar in operation to the circuit 100 and its associated components in FIG. 6 (and therefore reference numerals are incremented by one hundred), with the following exceptions. The signals provided to the inputs of the phase detector circuit 208 are taken from the outputs of the de-multiplexers 210 and thus do not include the received serial data stream. Thus, the phase detection operation includes comparing the de-multiplexed output signals against each other to detect a phase difference. This is referred to as over-sampled phase detection because more samples are employed than required to demultiplex the data. For example, 3 detectors might sample the stream at three different phase offsets of the de-multiplexing clock— and one of these may be selected as the valid data. This is best understood by considering the act of sampling the data with a clock. This may be done with, for example, a digital latch circuit. The latch samples the data at the instant the clock makes its transition from low to high. If this sampling instant occurs when the data to be de-multiplexed is undergoing a transition, then there will be uncertainty in the value of the sampled data and data recovery will not be reliable. It is desirable to sample said data with the clock at a time when the data is not undergoing transition, thereby greatly increasing the certainty with which the data can be sampled. In the oversampling technique, multiple samples of the data are employed and used to properly position the phase of the de-multiplexing clock so that one of the multiple (typically 3) samples is always valid. Such a technique has been described in the Buchwald et al. reference, as well as in C-K Yang and M.A. Horowitz "A 0.8 micron CMOS 2.5 Gb/s oversampling receiver and transmitter for serial links," IEEE J. Solid State Circuits, vol. 31, no. 12 p. 2015, 1996, the disclosure of which is incorporated herein by reference. Advantageously, since the phase detector 208 does not consider the received serial data stream, but only the de-multiplexed outputs, the phase detector may operate at the lower frequency of the de-multiplexers.

Figure 8:
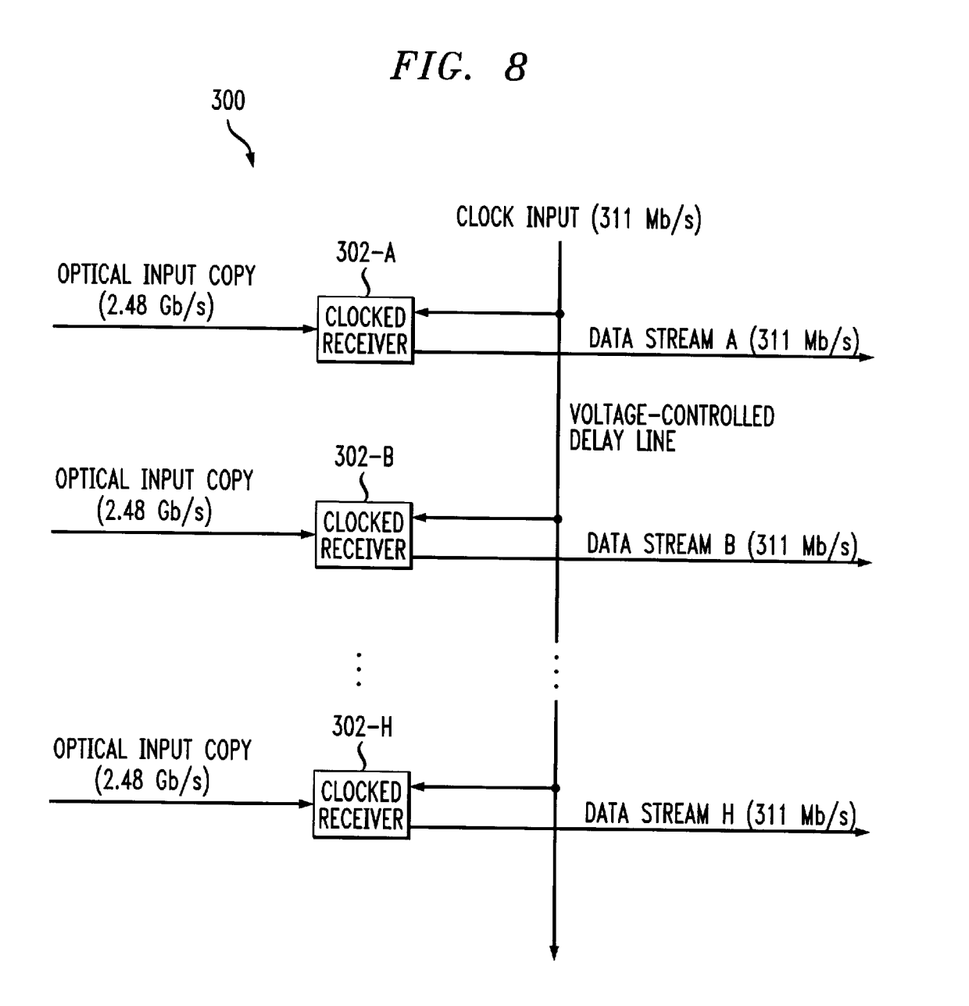
FIG. 8 is a schematic diagram of a receiver system employing clocked optical receivers for use with a sub-harmonic clock recovery and de-multiplexing circuit according to the invention.

Referring to FIG. 8, a schematic diagram of a receiver system employing clocked optical receivers for use with a sub-harmonic clock recovery and de-multiplexing circuit according to the invention is shown. It is to be appreciated that the sub-harmonic clock recovery and de-multiplexing techniques of the invention are extensible to very high data rates, since electronic logic need only function at the serial rate in the phase detector (FIG. 6) and at the inputs to the D-latch samplers (de-multiplexers). It may be advantageous to implement systems employing these techniques with an all-optical signal transport to further reduce the need for high speed electronic elements. Such an implementation requires high-speed sampling of the input optical data stream at a lower clock rate. FIG. 8 illustrates such an implementation. That is, the portion of the receiver circuit 300 shown in FIG. 8 depicts an embodiment where the de-multiplexers of FIGS. 6 and 7 are replaced with synchronous clocked optical receivers 302 (as shown 302-A through 302-H). The sub-harmonic clock recovery portion of the receiver is not shown, however, the clock signal bus labeled "Clock Input (311 Mb/sec)" represents the clock signals output by the PLL circuit (FIG. 6 or 7). Thus, the clock inputs are used to time the optical clock receivers 302 such that an input serial optical data stream of 2.48 Gb/sec may be de-multiplexed into multiple parallel data streams of 311 Mb/sec.

The synchronous clocked optical receivers 302 may be in the form described in the U.S. patent application by T. K. Woodward and A. L. Lentine identified by Ser. No. 68/887,180, filed Jul. 7, 1997, and entitled: "De-multiplexing with Clocked-Optical Receivers," the disclosure of which is incorporated herein by reference.

Figure 9:
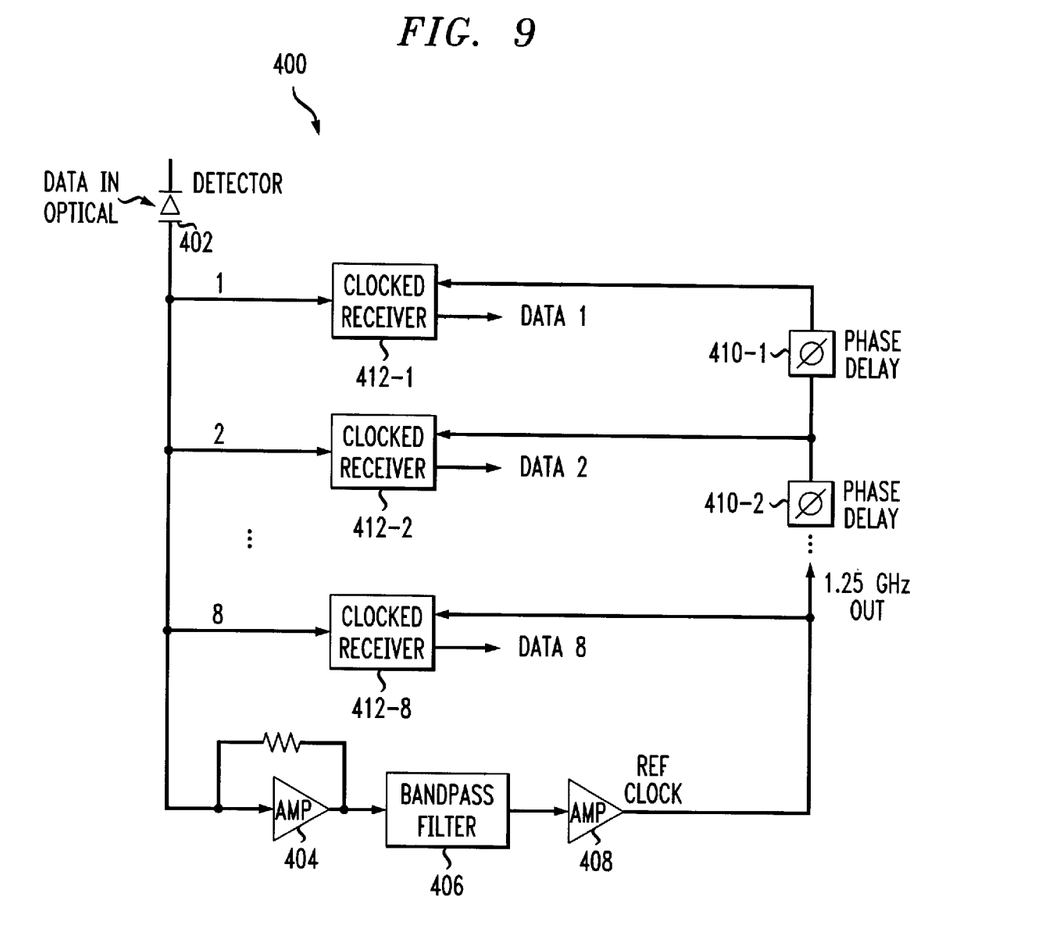
FIG. 9 is a schematic diagram of a receiver system employing clocked optical receivers and a sub-harmonic clock recovery and de-multiplexing circuit according to a third illustrative embodiment of the invention.

Referring now to FIG. 9, a schematic diagram of a receiver system employing clocked optical receivers and a sub-harmonic clock recovery and de-multiplexing circuit according to a third illustrative embodiment of the invention is shown. The circuit 400 includes an optical signal detector 402, a first amplifier 404, a bandpass filter 406, a second amplifier 408, a plurality of phase delay elements 410, and a plurality of clocked receivers 412. This implementation is suitable when the fidelity of the filtered clock tone provided by the amplifier 408 is sufficient for de-multiplexing. If this is not the case, then the clock tone may be used instead to phase lock a PLL, whose output is then coupled to delay elements 410. Further, this PLL does not generate a multitude of phases, but only a single phase. Delay line elements 410 then provide adjustable phase delays and multiple clock phases suitable for driving the sampling gates of clocked receivers 412. For example, these clocked receivers may be similar to those described in U.S. Pat. No. 5,644,418, the disclosure of which is incorporated herein by reference. It is to be understood that one could employ multiple optical detectors and also closed loop control of the phase delay circuits, should this be desirable, by means of delay locked loops and phase comparators.

Figure 10:
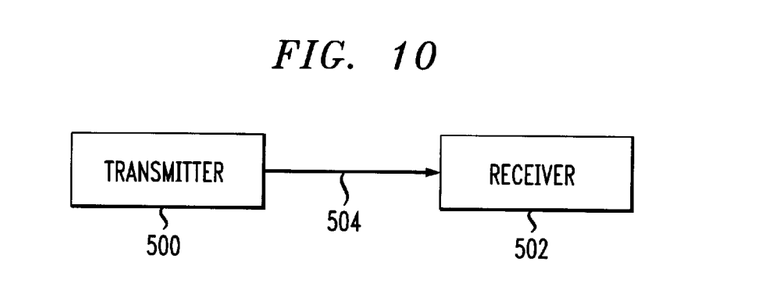
FIG. 10 is a block diagram of one embodiment of a data transmission system in accordance with which the present invention may be employed.

Referring now to FIG. 10, a block diagram is shown of one embodiment of a data transmission system in accordance with which the present invention may be employed. The system includes a transmitter 500 operatively coupled to a receiver 502 via a data transmission link 504. It is to be understood that the transmitter may employ one or more of the timing information enriching methodologies described herein, while the receiver may employ one or more of the sub-harmonic de-multiplexing methodologies described herein. The data transmission link 504 may be any type of suitable link and, in one particular embodiment, is an optical fiber link capable of transmitting data at optical frequencies between the transmitter and receiver.

It should be noted that the elements of the circuits illustrated in the figures may be implemented in a variety of ways. For example, each transmitter or receiver circuit may be implemented via discrete electronic logic, one or more application-specific integrated circuits or one or more signal processing devices including one or more processors and associated memory. The techniques of the invention may be implemented in a transmitter-based integrated circuit embodiment or a receiver-based integrated circuit embodiment for use in a communications system. The inventive techniques may be implemented in a transceiver-based integrated circuit embodiment. Given the inventive teachings herein, one of ordinary skill in the art will contemplate various other implementations, embodiments and applications.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A method for use in a data transmission system, the method comprising the steps of:

adding timing information to a serial data stream;

recovering the timing information from the serial data stream to generate a plurality of clock signals associated with the timing information, each clock signal having a common frequency and a different phase associated therewith, the common frequency being less than a frequency associated with the serial data stream; and converting the serial data stream to a plurality of parallel data streams respectively using the plurality of clock signals.

2. The method of claim 1, wherein the timing information includes one or more sub-harmonic clock tones.

3. The method of claim 1, wherein the timing information adding operation includes modifying a transmission code used to encode the serial data stream.

4. The method of claim 3, wherein the transmission code modifying operation includes inserting a transition bit pattern in a given code sequence, the transition bit pattern corresponding to the timing information.

5. The method of claim 3, wherein the transmission code modifying operation includes inserting a code character between code sequences, the code character corresponding to the timing information.

6. The method of claim 1, wherein the timing information adding operation includes inserting one or more clock tones directly into the serial data stream.

7. The method of claim 1, wherein the timing information recovery operation includes filtering the timing information from the serial data stream.

8. The method of claim 7, wherein the timing information recovery operation includes detecting a phase difference between the serial data stream and at least one of the plurality of parallel data streams.

9. The method of claim 8, wherein the timing information recovery operation includes aligning the phases associated with one or more of the plurality of clock signals based on the detected phase difference.

10. The method of claim 7, wherein the timing information recovery operation includes detecting a phase difference between at least two of the plurality of parallel data streams.

11. The method of claim 1, wherein the converting operation includes respectively sampling the serial data stream in accordance with the plurality of clock signals.

12. The method of claim 1, wherein the plurality of parallel data streams has a common frequency which is less than the frequency associated with the serial data stream.

13. A method of converting a serial data stream to a plurality of parallel data streams, the method comprising the steps of:
   extracting timing information, previously added to the serial data stream, from the serial data stream to generate at least one clock signal, wherein the at least one clock signal has a frequency which is not equivalent to a frequency associated with the serial data stream; and
   generating the plurality of parallel data streams from the serial data stream using the at least one clock signal.

14. The method of claim 13, wherein the timing information is extracted via a band-pass filter.

15. Apparatus for converting a serial data stream to a plurality of data streams, the apparatus comprising:
   a filter circuit to extract timing information, previously added to the serial data stream, from the serial data stream;
   a clock generation circuit, operatively coupled to the filter circuit, to generate a plurality of clock signals from the extracted timing information, wherein the plurality of clock signals has a common frequency which is less than a frequency associated with the serial data stream; and
   a plurality of de-multiplexer circuits, operatively coupled to the clock generation circuit, to convert the serial data stream to a plurality of parallel data streams respectively using the plurality of clock signals.

16. The apparatus of claim 15, further comprising a phase detection circuit, responsive to the serial data stream and at least one of the plurality of parallel data streams, to detect a phase difference between the streams.

17. The apparatus of claim 16, further comprising a phase shifting circuit, operatively coupled between the phase detection circuit and the clock generation circuit, to align phases associated with the plurality of clock signals.

18. The apparatus of claim 15, further comprising a phase detection circuit, responsive to at least two of the plurality of parallel data streams, to detect a phase difference between the streams.

19. The apparatus of claim 15, wherein the filter, clock generation, and de-multiplexing circuits are in the form of an integrated circuit.

20. Apparatus for converting a serial data stream to a plurality of data streams, the apparatus comprising:
   a filter circuit to extract timing information, previously added to the serial data stream, from the serial data stream;
   a clock generation circuit, operatively coupled to the filter circuit, to generate at least one clock signal from the extracted timing information wherein the at least one clock signal has a frequency which is not equivalent to a frequency associated with the serial data stream; and
   a plurality of de-multiplexer circuits, operatively coupled to the clock generation circuit, to convert the serial data stream to a plurality of parallel data streams using the at least one clock signal.

21. The apparatus of claim 20, wherein the plurality of parallel data streams has a common frequency which is less than the frequency associated with the serial data stream.

22. A data transmission system, comprising:
   a data transmitter operable to enrich a serial data stream with timing information; and
   a data receiver, operatively coupled to the data transmitter, operable to: (i) recover the timing information from the serial data stream to generate a plurality of clock signals, each clock signal having a common frequency and a different phase associated therewith, the common frequency being less than a frequency associated with the serial data stream, and (ii) convert the serial data stream to a plurality of parallel data streams respectively using the plurality of clock signals.

23. The system of claim 22, wherein the serial data stream includes data at an optical frequency.

24. The system of claim 23, wherein the common frequency of the parallel data streams is less than the optical frequency of the serial data stream.

* * * * *